(12) United States Patent
Manfra et al.

(10) Patent No.: US 11,127,820 B2
(45) Date of Patent: Sep. 21, 2021

(54) QUANTUM WELL FIELD-EFFECT TRANSISTOR AND METHOD FOR MANUFACTURING THE SAME

(71) Applicant: Microsoft Technology Licensing, LLC, Redmond, WA (US)

(72) Inventors: Michael James Manfra, West Lafayette, IN (US); Candice Fanny Thomas, Isle (FR)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/577,570

(22) Filed: Sep. 20, 2019

(65) Prior Publication Data

US 2021/0091185 A1 Mar. 25, 2021

(51) Int. Cl.
*H01L 29/12* (2006.01)
*H01L 29/205* (2006.01)
*H01L 29/66* (2006.01)
*H01L 29/778* (2006.01)

(52) U.S. Cl.
CPC .......... *H01L 29/122* (2013.01); *H01L 29/205* (2013.01); *H01L 29/66462* (2013.01); *H01L 29/66977* (2013.01); *H01L 29/778* (2013.01)

(58) Field of Classification Search
CPC .................. H01L 29/122; H01L 29/205; H01L 29/66462; H01L 29/66977; H01L 29/778
USPC .......................................................... 257/24
See application file for complete search history.

(56) References Cited

U.S. PATENT DOCUMENTS

| 2012/0138899 A1* | 6/2012 | Nainani | H01L 29/66462 257/24 |
| 2017/0263742 A1* | 9/2017 | Endoh | H01L 29/7782 |
| 2018/0294362 A1* | 10/2018 | Fukui | H01L 29/78681 |

FOREIGN PATENT DOCUMENTS

EP 2120266 A1 11/2009

OTHER PUBLICATIONS

Cooke, Mike, "Electromagnetic Alchemy", In Journal of Compounds & Advanced Silicon, vol. 2, Issue 8, Oct. 2007, pp. 57-61.
Faralli, et al., "Full-Band Particle-Based Simulation of 85 nm AlInSb/InSb Quantum Well Transistors", In Journal of Computational Electronics, vol. 5, Issue 4, Dec. 9, 2006, pp. 483-486.
"International Search Report and Written Opinion Issued in PCT Application No. PCT/US20/039738", dated Sep. 15, 2020, 32 Pages.

* cited by examiner

*Primary Examiner* — Tong-Ho Kim
(74) *Attorney, Agent, or Firm* — Withrow & Terranova, PLLC

(57) ABSTRACT

A quantum well field-effect transistor (QWFET) includes a barrier layer, a quantum well layer, and a spacer layer. The quantum well layer is on the barrier layer. The barrier layer and the spacer layer comprise aluminum indium antimonide that is undoped. The quantum well layer comprises indium antimonide. The spacer layer is on the quantum well layer. The quantum well layer and the spacer layer are between a source contact and a drain contact. A gate contact is on a dielectric layer, which is on the spacer layer. By providing the barrier layer and the spacer layer as undoped layers, a performance of the QWFET may be improved.

16 Claims, 5 Drawing Sheets

QUANTUM WELL FIELD-EFFECT TRANSISTOR AND METHOD FOR MANUFACTURING THE SAME

FIELD OF THE DISCLOSURE

The present disclosure is related to quantum well field-effect transistors (QWFETs) and methods for manufacturing the same.

BACKGROUND

Quantum well field-effect transistors (QWFETs) have been studied for low-voltage, high-performance applications. In particular, QWFETs with a quantum well comprising indium antimonide have been studied due to the high carrier mobility of indium antimonide. FIG. 1 shows a conventional QWFET 10 including an indium antimonide quantum well. The conventional QWFET 10 includes an aluminum indium antimonide ($In_xAl_{1-x}Sb$) barrier layer 12, an indium antimonide quantum well layer 14 on the barrier layer 12, and an aluminum indium antimonide ($In_xAl_{1-x}Sb$) spacer layer 16 on the quantum well layer 14. A source contact 18 and a drain contact 20 are on the barrier layer 12 adjacent to the quantum well layer 14 and the spacer layer 16 such that the source contact 18 and the drain contact 20 are in contact with the quantum well layer 14 and the spacer layer 16 and the quantum well layer 14 and the spacer layer 16 run between the source contact 18 and the drain contact 20. A dielectric layer 22 is on the spacer layer 16. A gate contact 24 is on the dielectric layer 22.

The barrier layer 12 and the spacer layer 16 are remotely doped to form a first Δ-doped layer 26A adjacent to a bottom side of the quantum well layer 14 and a second Δ-doped layer 26B adjacent to a top side of the quantum well layer 14. Accordingly, the quantum well layer 14 is sandwiched between the first Δ-doped layer 26A and the second Δ-doped layer 26B. The Δ-doped layers 26 are doped to provide excess electrons (e.g., using silicon as a dopant), which are pulled into the quantum well formed by the quantum well layer 14. Accordingly, the quantum well layer 14 forms a conductive channel between the source contact 18 and the drain contact 20 during steady state conditions (i.e., zero gate bias) such that the conventional QWFET 10 is a depletion mode device.

In operation, the conventional QWFET 10 is on such that there is conduction between the drain contact 20 and the source contact 18 when zero or positive bias is applied to the gate contact 24. As discussed above, this is because the electrons added by the Δ-doped layers 26 are pulled into the quantum well formed by the quantum well layer 14 such that the quantum well layer 14 forms a conductive channel. The conventional QWFET 10 may thus be referred to as a depletion mode device. To turn the conventional QWFET 10 off such that conduction is limited between the drain contact 20 and the source contact 18, a negative bias below a threshold voltage of the device is applied to the gate contact 24. The negative bias creates an electric field that pushes electrons out of the quantum well layer 14 and thus limits conduction between the drain contact 20 and the source contact 18.

While functional, the performance of the conventional QWFET 10 may be unstable over time. For example, a conductance of the conventional QWFET 10 may drift or even jump abruptly over time. Accordingly, there is a need for a QWFET 10 device with stable performance.

SUMMARY

In one exemplary embodiment, a quantum well field-effect transistor (QWFET) includes a barrier layer, a quantum well layer, and a spacer layer. The quantum well layer is on the barrier layer. The barrier layer and the spacer layer comprise aluminum indium antimonide that is undoped. The quantum well layer comprises indium antimonide. The spacer layer is on the quantum well layer. The quantum well layer and the spacer layer are between a source contact and a drain contact. A gate contact is on a dielectric layer, which is on the spacer layer. By providing the barrier layer and the spacer layer as undoped layers, a performance of the QWFET may be improved.

In one exemplary embodiment, a method for manufacturing a QWFET includes providing a barrier layer, providing a quantum well layer on the barrier layer, providing a spacer layer on the quantum well layer, providing a source contact and a drain contact, and providing a dielectric layer and a gate contact. The barrier layer and the spacer layer comprise aluminum indium antimonide that is undoped. The quantum well layer comprises indium antimonide. The source contact and the drain contact are provided such that the quantum well layer and the spacer layer are between them. The dielectric layer is provided on the spacer layer, and the gate contact is provided on the dielectric layer. By providing the barrier layer and the spacer layer as undoped layers, a performance of the QWFET device provided by the method may be improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
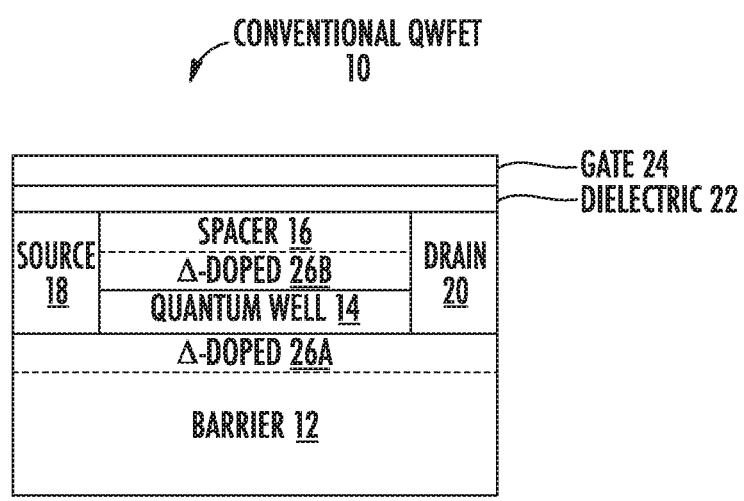
FIG. 1 illustrates a conventional quantum well field-effect transistor (QWFET).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed above, conventional quantum well field-effect transistors (QWFETs) experience inconsistent performance over time, and in particular experience conductance drift and jumping over time. The inventors of the subject matter of the present disclosure discovered that said inconsistencies in performance are caused by disorder created in the semiconductor structure of a conventional QWFET, and further discovered that said disordered structure is caused by the Δ-doping layers due to the presence of extra electrons therein.

Figure 2:
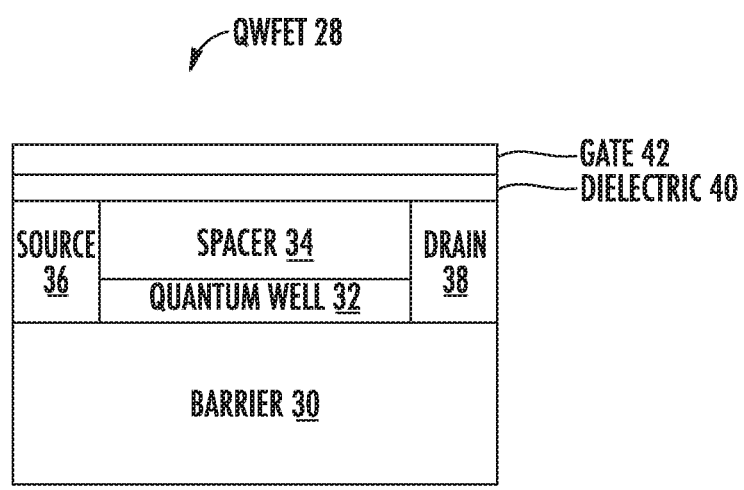
FIG. 2 illustrates a QWFET according to one embodiment of the present disclosure.

To solve the deficiencies of conventional QWFETs, FIG. 2 shows a QWFET 28 according to one embodiment of the present disclosure. The QWFET 28 includes a barrier layer 30, a quantum well layer 32 on the barrier layer 30, and a spacer layer 34 on the quantum well layer 32. A source contact 36 and a drain contact 38 are on the barrier layer 30 adjacent to the quantum well layer 32 and the spacer layer 34 such that the source contact 36 and the drain contact 38 are in contact with the quantum well layer 32 and the spacer layer 34 and the quantum well layer 32 and the spacer layer 34 are between the source contact 36 and the drain contact 38. A dielectric layer 40 is on the spacer layer 34. A gate contact 42 is on the dielectric layer 40.

Notably, neither the barrier layer 30 nor the spacer layer 34 is doped in the QWFET 28. In other words, the QWFET 28 does not include any Δ-doped layers such that a doping profile of the entirety of the barrier layer 30 and the entirety of the spacer layer 34 is flat. Only the doping inherent to the material of the barrier layer 30 and the spacer layer 34 is present.

In one embodiment, the barrier layer 30 and the spacer layer 34 comprise aluminum indium antimonide ($In_xAl_{1-x}Sb$—and more specifically $In_xAl_{1-x}Sb$ with 8-12% Al). As discussed above, no dopants are introduced into the aluminum indium antimonide such that in at least one embodiment the barrier layer 30 and the spacer layer 34 consist only of undoped aluminum indium antimonide. As discussed herein, "undoped" means not intentionally or unintentionally doped with an additional doping agent (such as silicon), and thus the barrier layer 30 and the spacer layer 34 include only the inherent doping concentration of the aluminum indium antimonide. The quantum well layer 32 may comprise indium antimonide. The source contact 36 and the drain contact 38 may comprise any suitable metal for making an ohmic contact, and in particular may comprise titanium gold, niobium titanium nitride, or the like. The dielectric layer 40 may comprise any suitable oxide such as aluminum oxide. The gate contact 42 may comprise any suitable metal for making a gate contact such as titanium gold.

In various embodiments, a thickness of the barrier layer 30 may be between 10 nm and 4 μm. A thickness of the quantum well layer 32 may be between 10 nm and 30 nm. A thickness of the spacer layer 34 may be between 10 nm and 50 nm. A distance between the source contact 36 and the drain contact 38, which defines a channel of the device, may be between 100 nm and 10 μm. A thickness of the dielectric layer 40 may be between 10 nm and 40 nm.

In operation, the QWFET 28 is off such that there is no or minimal conduction between the drain contact 38 and the source contact 36 when zero or negative bias is applied to the gate contact 42. This is because without the Δ-doped layers there are not enough electrons that become trapped in the quantum well created by the quantum well layer 32 to provide a conductive channel. The QWFET 28 may thus be referred to as an enhancement mode device, which is opposite that of conventional QWFETs as discussed above. To turn the QWFET 28 on such that there is conduction between the drain contact 38 and the source contact 36, a positive bias above a threshold voltage of the device is applied to the gate contact 42. The positive bias creates an electric field that pulls electrons into the quantum well layer 32 and thus provides a conductive channel between the drain contact 38 and the source contact 36. The electrons may be sourced from the source contact 36 and the drain contact 38 areas.

Notably, the performance of the QWFET 28 is very stable over time. A conductance of the QWFET 28 has minimal drift over time, and does not jump. As discussed above, this is due to the removal of the Δ-doped layers required by conventional QWFETs, since these layers create disorder in the semiconductor structure of conventional QWFETs. Accordingly, the QWFET 28 provides better performance than its conventional counterparts.

Figure 3:
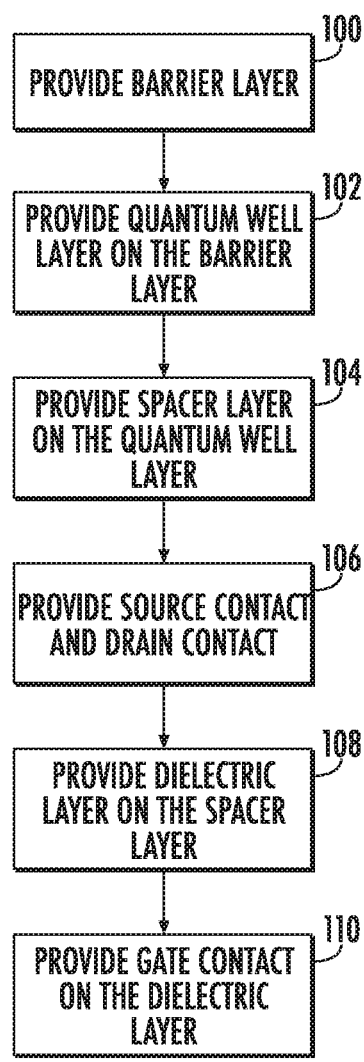
FIG. 3 is a flow chart illustrating a method for manufacturing a QWFET according to one embodiment of the present disclosure.

FIG. 3 is a flow chart illustrating a method for manufacturing the QWFET 28 according to one embodiment of the present disclosure. FIGS. 4A through 4F illustrate the steps of the method and FIG. 3 and thus are discussed in tandem with FIG. 3 below. The barrier layer 30 is provided (block 100 and FIG. 4A). The barrier layer 30 may be provided by any suitable process, for example by an epitaxy process. The quantum well layer 32 is provided on the barrier layer 30 (block 102 and FIG. 4B). Again, the quantum well layer 32 may be provided by any suitable process, for example by an epitaxy process. The spacer layer 34 is provided on the quantum well layer 32 (block 104 and FIG. 4C). Again, the spacer layer 32 may be provided by any suitable process, for example by an epitaxy process.

Figure 4A:
FIGS. 4A through 4F illustrate the method for manufacturing the QWFET in FIG. 3 according to one embodiment of the present disclosure.
Figure 4B:
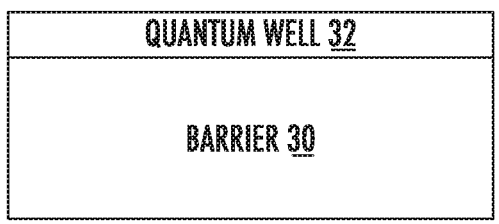
Figure 4C:
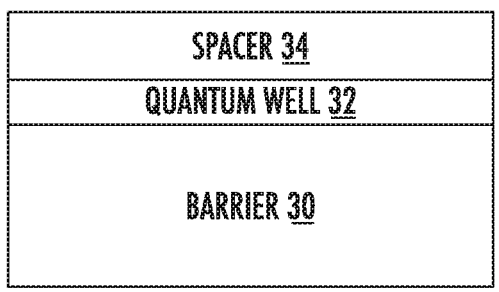
Figure 4D:
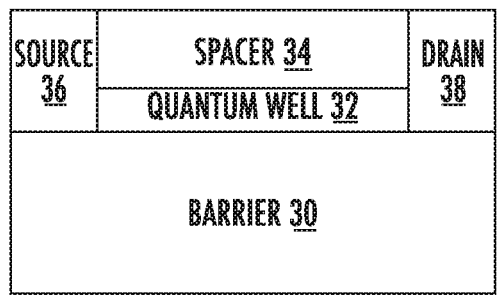
Figure 4E:
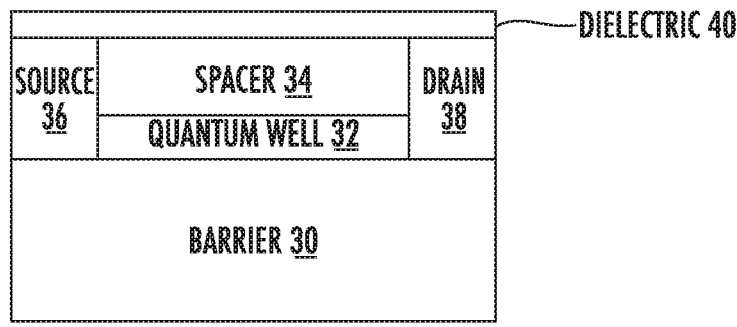
Figure 4F:
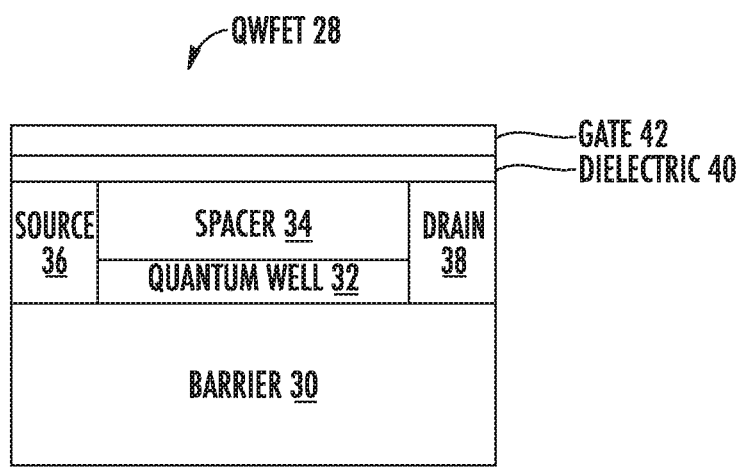

The source contact 36 and the drain contact 38 are provided (block 106 and FIG. 4D). The source contact 36 and the drain contact 38 may be provided by any suitable process, for example a deposition process. One or more trenches for the source contact 36 and the drain contact 38 may be provided before depositing the metal of the source contact 36 and the drain contact 38. The dielectric layer 40 is provided on the spacer layer 34 (block 108 and FIG. 4E). The dielectric layer 40 may be provided by any suitable process, for example a deposition process such as atomic layer deposition. The gate contact 42 is provided on the dielectric layer 40 (block 110 and FIG. 4F). The gate contact 42 may be provided by any suitable process, for example a deposition process. Those skilled in the art will readily appreciate that there may be many different processes for providing each one of the barrier layer 30, the quantum well layer 32, the spacer layer 34, the source contact 36, the drain contact 38, the dielectric layer 40, and the gate contact 42, all of which are contemplated herein.

Those skilled in the art will recognize improvements and modifications to the preferred embodiments of the present disclosure. All such improvements and modifications are considered within the scope of the concepts disclosed herein and the claims that follow.

What is claimed is:

1. A quantum well field-effect transistor (QWFET) comprising:
    a source contact, a drain contact, and a gate contact;
    a barrier layer comprising aluminum indium antimonide, wherein the barrier layer is undoped;
    a quantum well layer on the barrier layer, wherein the quantum well layer is between the source contact and the drain contact and the quantum well layer comprises indium antimonide;
    a spacer layer directly on the quantum well layer, wherein the spacer layer is between the source contact and the drain contact, the spacer layer comprises aluminum indium antimonide, the spacer layer is undoped, and no Δ-doped layer exists directly adjacent to the spacer layer; and
    a dielectric layer on the spacer layer, wherein the gate contact is on the dielectric layer opposite the spacer layer.

2. The QWFET of claim 1 wherein the quantum well layer is directly on the barrier layer and the spacer layer is directly on the quantum well layer.

3. The QWFET of claim 2 wherein the barrier layer and the spacer layer consist of aluminum indium antimonide.

4. The QWFET of claim 3 wherein the QWFET is an enhancement mode device.

5. The QWFET of claim 2 wherein the QWFET is an enhancement mode device.

6. The QWFET of claim 1 wherein the barrier layer and the spacer layer consist of aluminum indium antimonide.

7. The QWFET of claim 6 wherein the QWFET is an enhancement mode device.

8. The QWFET of claim 1 wherein the QWFET is an enhancement mode device.

9. A method for manufacturing a quantum well field-effect transistor (QWFET) comprising:
    providing a barrier layer, wherein the barrier layer comprises aluminum indium antimonide and the barrier layer is undope;
    providing a quantum well layer on the barrier layer, wherein the quantum well layer comprises indium antimonide;
    providing a spacer layer directly on the quantum well layer, wherein the spacer layer comprises aluminum indium antimonide and the spacer layer is undoped;
    providing a source contact and a drain contact such that the quantum well layer and the spacer layer are between the source contact and the drain contact, wherein no Δ-doped layer exists directly adjacent to the spacer layer;
    providing a dielectric layer on the spacer layer; and
    providing a gate contact on the dielectric layer.

10. The method of claim 9 wherein the quantum well layer is provided directly on the barrier layer and the spacer layer is provided directly on the quantum well layer.

11. The method of claim 10 wherein the barrier layer and the spacer layer consist of aluminum indium antimonide.

12. The method of claim 11 wherein the QWFET is an enhancement mode device.

13. The method of claim 10 wherein the QWFET is an enhancement mode device.

14. The method of claim 9 wherein the barrier layer and the spacer layer consist of aluminum indium antimonide.

15. The method of claim 14 wherein the QWFET is an enhancement mode device.

16. The method of claim 9 wherein the QWFET is an enhancement mode device.

* * * * *